United States Patent
Li (10) Patent No.: US 8,764,132 B2
(45) Date of Patent: Jul. 1, 2014

(54) ENCLOSURE HAVING DETACHABLE PANEL ASSEMBLY

(75) Inventor: Ya-Zhong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 70 days.

(21) Appl. No.: 13/587,940

(22) Filed: Aug. 17, 2012

(65) Prior Publication Data

US 2013/0063006 A1  Mar. 14, 2013

(30) Foreign Application Priority Data

Sep. 8, 2011  (CN) .......................... 2011 1 0265417

(51) Int. Cl.
*H05K 5/00* (2006.01)
(52) U.S. Cl.
USPC ...................................................... 312/223.2
(58) Field of Classification Search
USPC ....................... 312/223.2, 257.1, 265.5, 265.6
See application file for complete search history.

(56) References Cited

U.S. PATENT DOCUMENTS

| | | | |
|---|---|---|---|
| 6,381,138 B1 * | 4/2002 | Chen | 361/724 |
| 6,382,744 B1 * | 5/2002 | Xiao | 312/223.2 |
| 7,252,351 B2 * | 8/2007 | Chen et al. | 312/223.2 |
| 8,382,214 B2 * | 2/2013 | Tang | 312/223.2 |
| 2004/0160149 A1 * | 8/2004 | Chen | 312/223.2 |
| 2007/0210684 A1 * | 9/2007 | Lin et al. | 312/223.2 |
| 2010/0244639 A1 * | 9/2010 | Chen et al. | 312/223.2 |
| 2012/0019116 A1 * | 1/2012 | Fan | 312/312 |

* cited by examiner

Primary Examiner — Daniel Rohrhoff
(74) Attorney, Agent, or Firm — Novak Druce Connolly Bove + Quigg LLP (57) ABSTRACT

A panel assembly includes a panel, a first mounting part and a second mounting part. The first mounting part and the second mounting part each include buckling pieces. Part of buckling pieces are moveable mounted on the first mounting part for mounting the first mounting part on a side of a cabinet. The another buckling pieces are immovable mounted on the second mounting part for mounting the second mounting part on an opposite side of the cabinet. When the buckling pieces of the first mounting part are in a free state, the buckling pieces of the first mounting part are attached on the other one of the two opposite sidewalls of the cabinet. When the buckling pieces of the first mounting part are pushed to move towards the second mounting part, the first mounting part are detached from the other one of the two opposite sidewalls of the cabinet.

17 Claims, 5 Drawing Sheets

ENCLOSURE HAVING DETACHABLE PANEL ASSEMBLY

BACKGROUND

1. Technical Field

The present disclosure relates to enclosures such as electronic device enclosures, and more particularly, to an enclosure with a panel assembly.

2. Description of Related Art

With progress in electronic technology, demands for computer have been increased.

A conventional computer has an enclosure for receiving and protecting electronic components. In some kinds of computers such as servers or workstations, certain of the electronic components are required to be maintained, repaired or replaced after operation of the computer for a long period. In order to access the electronic components, the enclosures generally incorporate detachable panels. By loosening screws threadedly engaged in a panel, the panel can be detached from the enclosure to expose the electronic components inside the enclosure. However, the detachment of the panel from the enclosure is inconvenient and time-consuming.

What is needed, therefore, is an enclosure with a panel assembly which can overcome the limitations described.

DETAILED DESCRIPTION

Figure 1:
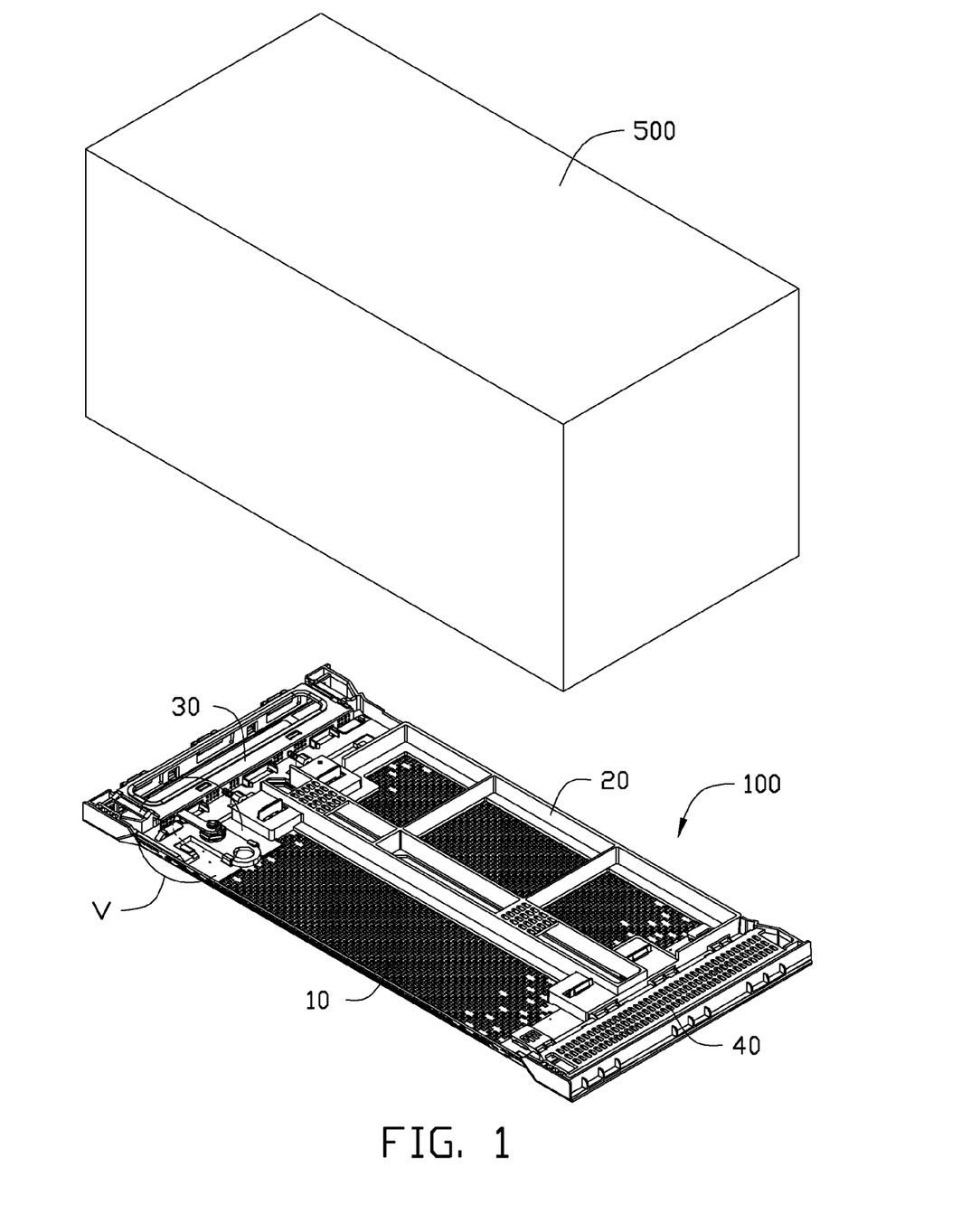
FIG. 1 is an assembled view of an enclosure having a panel assembly in accordance with an exemplary embodiment of the present disclosure.

Referring to FIG. 1, an enclosure having a panel assembly 100 in accordance with an exemplary embodiment of the present disclosure is shown. The panel assembly 100 includes a panel 10, a strengthening frame 20, a first mounting part 30 and a second mounting part 40. The strengthening frame 20 is attached on a top face of the panel 10. The first mounting part 30 and the second mounting part 40 are located at two opposite lateral sides of the panel 10, respectively. As shown in the visual angle of FIG. 1, the first mounting part 30 is located at a left lateral side of the panel 10, and the second mounting part 40 is located at a right lateral side of the panel 10. The strengthening frame 20 is configured for strengthening the panel 10. The first mounting part 30 and the second mounting part 40 are engaged with a cabinet 500 to mount the panel assembly 100 to the cabinet 500.

Figure 2:
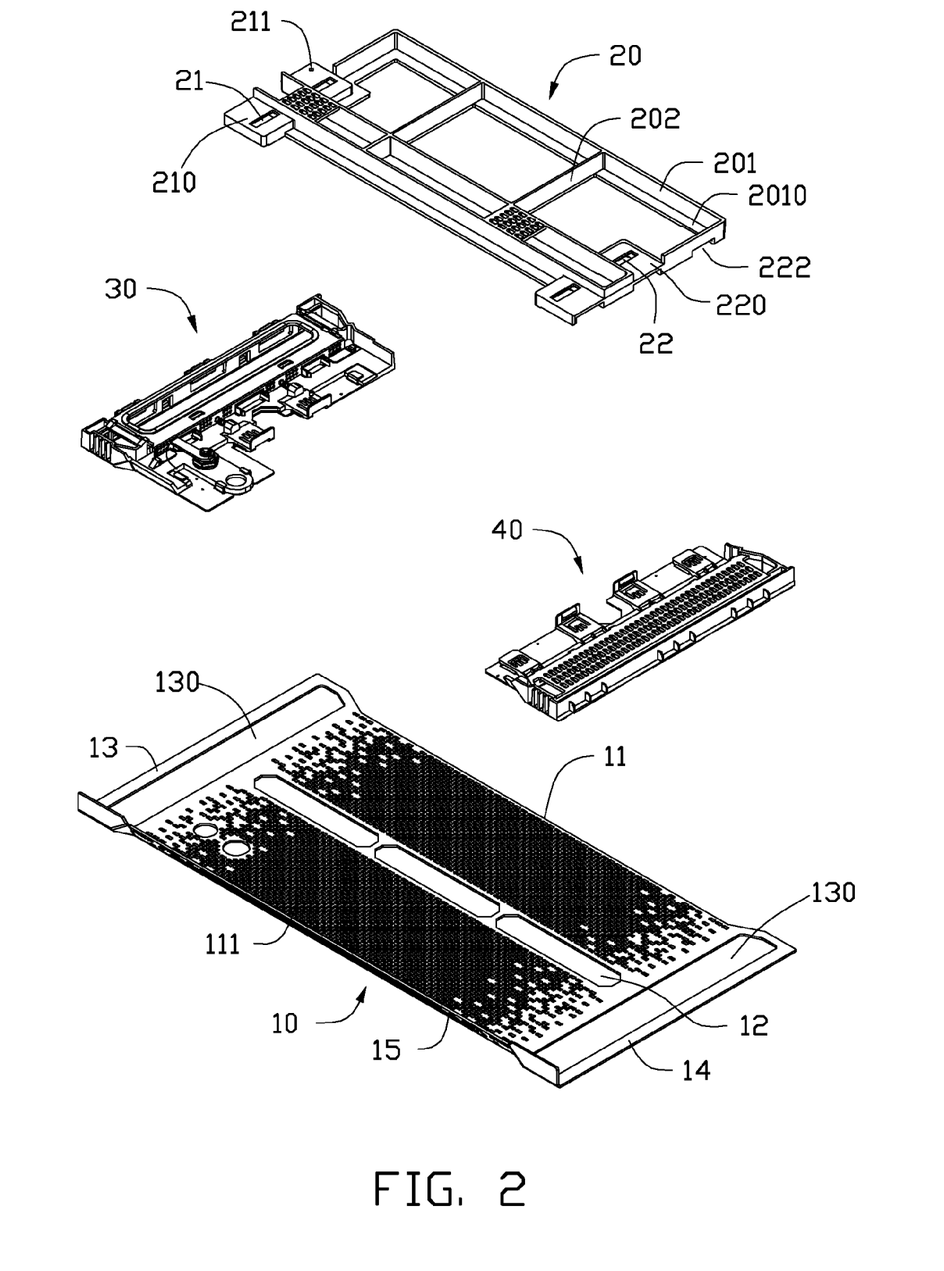
FIG. 2 is an exploded view of the panel assembly of FIG. 1.

Referring to FIG. 2, the panel 10 is made of metal and integrally formed as a single piece. The panel 10 includes a main plate 11, a first side wing 13 and a second side wing 14. The first side wing 13 and the second side wing 14 are respectively located at two opposite sides of the main plate 11, i.e. left and right sides of the main plate 11 viewed from the visual angle of FIG. 2. The main plate 11 defines three slots 12 in a middle portion thereof. The three slots 12 are spaced and arranged along a line. The main plate 11 further defines a plurality of ventilating holes 111 therein at two opposite sides of the three slots 12 for promoting heat dissipating efficiency of the cabinet 500. The first side wing 13 is titled slightly outwardly away from the left side of the main plate 11 for supporting the first mounting part 30. A first opening 130 is defined in a middle portion of the first side wing 13. The second side wing 14 is titled slightly outwardly away from the right side of the main plate 11 for supporting the second mounting part 40. A second opening 140 is defined in a middle portion of the second side wing 14. The second side wing 14 is identical to and symmetric with the first side wing 13. A front side of the main plate 11 is bent upwardly to form a protecting flange 15. When the panel assembly 100 is mounted on the cabinet 500, the protecting flange 15 prevents hands of a man from entering the cabinet 500 through a front side of the cabinet 500 to remove the panel assembly 100 from the cabinet 500.

The strengthening frame 20 is made of plastic. The strengthening frame 20 includes three transverse ribs 201 and four longitudinal ribs 202. Each of the transverse ribs 201 and the longitudinal ribs 202 is an angle bar. The transverse ribs 201 interconnect with the longitudinal ribs 202 perpendicularly. A first locking plate 210 and a second locking plate 220 are formed at two opposite sides of the strengthening frame 20, respectively. The first locking plate 210 connects with a leftmost longitudinal rib 202 and runs through left ends of two frontmost transverse ribs 202. The first locking plate 210 defines two first locking slots 21 therein. The left ends of the two frontmost transverse ribs 201 are located between the two first locking slots 21. The first locking plate 210 further defines a positioning hole 211 therein adjacent to the leftmost longitudinal rib 202. The rightmost longitudinal rib 202 defines a positioning recess 222 therein facing the panel 10. The second locking plate 220 defines two second locking slots 22 therein. Right ends of the two frontmost transverse ribs 201 are located between the two second locking slots 22.

Figure 3:
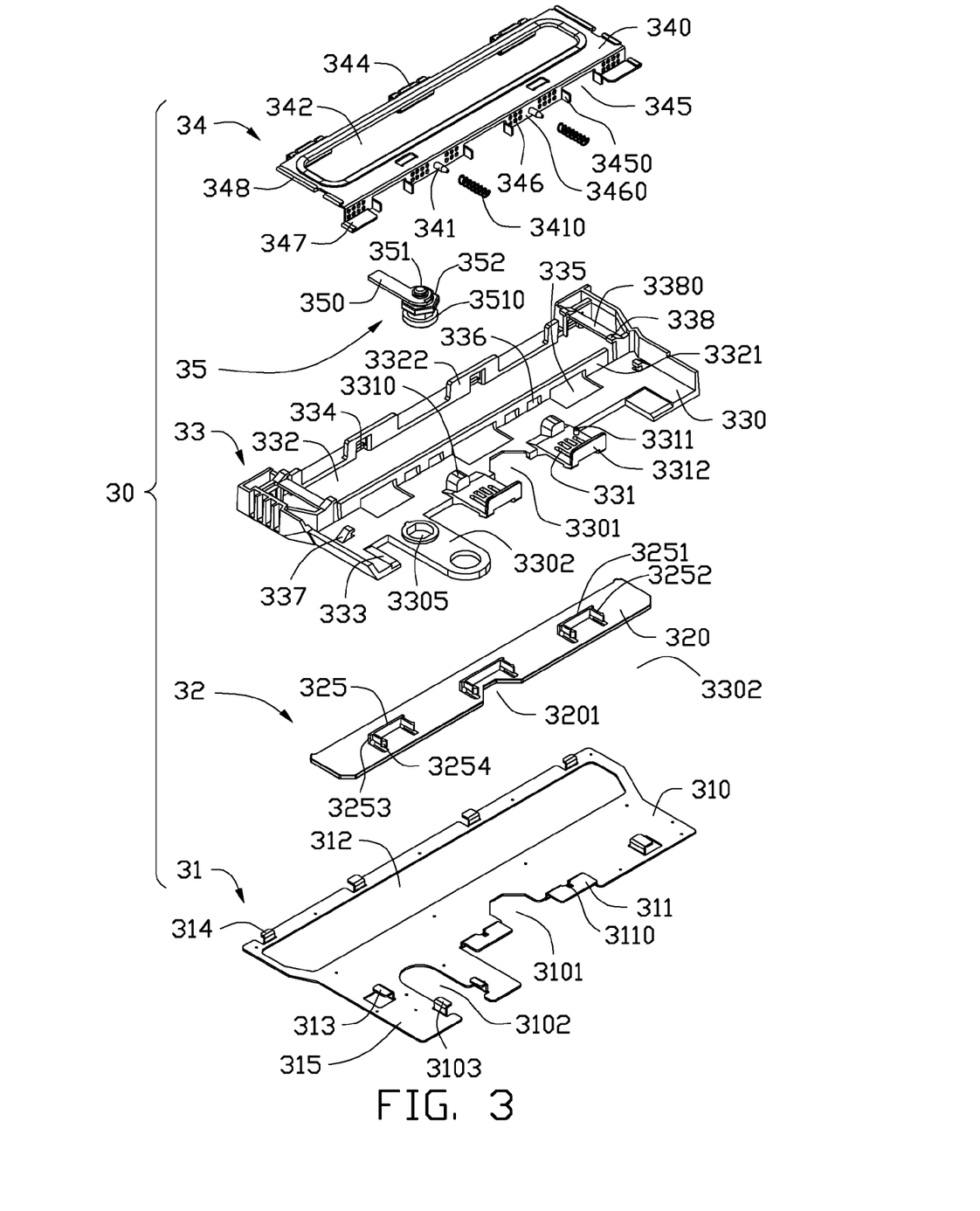
FIG. 3 is an enlarged view of a first mounting part of the panel assembly of FIG. 1.

Referring to FIG. 3, the first mounting part 30 includes a first structure member 31, a second structure member 32, a third structure member 33, a fourth structure member 34 and a locking member 35.

The first structure member 31 is a metallic plate. The first structure member 31 is mounted on the panel 10 in a manner of spot welding instead of screws fixing, thereby saving a cost thereof. The first structure member 31 includes a main body 310. The main body 310 defines a contraposition recess 3101 in a middle portion of a right lateral side thereof. The contraposition recess 3101 faces a right side of the main body 310 and is aligned with the slot 12 of the panel 10. Two L-shaped buckling pieces 311 protrude from the right lateral side of the main body 310. The contraposition recess 3101 is located between the two buckling pieces 311. Each of the buckling pieces 311 includes a vertical portion extending perpendicularly from the main body 310 and a horizontal portion extending horizontally from a free end of the vertical portion. The buckling piece 311 defines a buckling hole 3110 therein. The buckling hole 3110 extends from the vertical portion towards the horizontal portion of the buckling piece 311. The buckling hole 3110 is configured for mounting the third structure member 33. A protruding portion 315 is formed at the right lateral side of the main body 310 and adjacent to a front lateral side of the main body 310. A receiving recess 3102 is defined in the protruding portion 315. The receiving recess 3102 is straight and extends from a free end of the protruding portion 315 toward the right lateral side of the main body 310. Two L-shaped first clipping pieces 3103 are formed on the protruding portion 312 at two opposite sides of the receiving recess 3102. The two first clipping pieces 3103 extend towards each other and spaced from each other. Two second clipping pieces 313 are formed on the main body 310 adjacent to the front lateral side and a rear lateral side of the main body 310, respectively. The two second clipping pieces 313 extend away from each other. A left portion of the main body 310 has a shape identical with that of the first side wing 13 of the panel 10. An operating hole 312 is defined in the left portion corresponding to the first opening 130 of the first side wing 13. Four third clipping pieces 314 are formed at a left lateral side of the main body 310. The first clipping piece 3103, the second clipping piece 313 and the third clipping piece 314 are used for clipping the third structure member 33 on the first structure member 31.

The second structure member 32 is strip-shaped and made of plastic. The second structure 32 includes a main plate 320 and three engaging claws 325 formed on the main plate 320. The main plate 320 defines a contraposition recess 3201 therein corresponding to the contraposition recess 3101 of the first structure member 31. The three engaging claws 325 are evenly spaced from each other. Each of the engaging claws 325 includes a connecting strip 3251, and two arm portions 3252 formed at two opposite end portions of the connecting portion 3251, respectively. The connecting portion 3251 connects with the main plate 320. The arm portions 3252 of the engaging claws 325 are parallel to and spaced from the main plate 320. The two arm portions 3252 of each engaging claw 325 are space from each other. A distance between the two arm portions 3252 of a middle one of the three engaging claws 325 is larger than that of each one of the other two of the three engaging claws 325. The contraposition recess 3201 is just located between the two arm portions 3252 of the middle one of the three engaging claws 325. Each of the arm portions 3252 includes a hook portion 3254 formed at a free end thereof. The hooking portions 3254 of each of the engaging claws 325 protrude outwardly away from each other. Two opposite end portions of each of the connecting portions 3251 extend beyond the corresponding arm portions 3252 to form a shoulder portion 3253 thereof. Each of the shoulder portions 3253 faces the hook portion 3254 of the corresponding arm portion 3252.

The third structure member 33 is made of plastic and includes a main plate 330. The main plate 330 defines a contraposition recess 3301 in a right lateral side thereof corresponding to the contraposition recess 3201 of the second structure member 32. Two hooking plates 331 extend outwardly from the right lateral side of the main plate 330 at two opposite sides of the contraposition recess 3301, respectively. A vertical portion 3312 extends upwardly and perpendicularly from a free end of each of the hooking plate 331, for engaging with the strengthening frame 20. Two blocking protrusions 3310 are formed on a top face of the main plate 330 corresponding to the two hooking plates 331. Each of the blocking protrusions 3310 is adjacent to the right lateral side of the main plate 330 and faces the vertical portion 3312. A rear one of the two hooking plates 331 further includes a positioning pole 3311 formed thereon corresponding to the positioning hole 211 of the strengthening frame 20. The third structure member 33 further includes a protruding portion 3302 formed on the right lateral side of the main plate 330 corresponding to the receiving recess 3102 of the second structure member 32. A width of the protruding portion 3302 is equal to that of the recess receiving recess 3102. A locking hole 3305 is defined in the protruding portion 3302 adjacent to the main plate 330 of the third structure member 33. Two engaging tabs 333 are formed on two opposite ends of the right lateral side of the main plate 330 corresponding to the clipping pieces 313 of the first structure member 31. Two clipping protrusions 337 are formed on the top face of the main plate 330. Each of the two clipping protrusions 337 is wedge-shaped and protrudes upwardly and slantways. A gap is formed between the clipping protrusions 337 and the top face of the main plate 330 for clipping the fourth structure member 34 therein. An operating hole 332 is defined in the main plate 330 adjacent to a left lateral side of the main plate 330 corresponding to the operating hole 312 of the first structure member 31. A protruding wall 3321 protrudes upwardly from a middle portion of the main plate 330 adjacent to the operating hole 332. The protruding wall 3321 is parallel to the left lateral side of the main plate 330. The protruding wall 3321 defines three clipping holes 335 therein for clipping the second structure member 32 and the fourth structure member 34. Each of the clipping holes 335 extends from a middle portion of the blocking wall 3321 towards the main plate 330. A width of a middle one of the three clipping holes 335 is larger than that of each one of the other two clipping holes 335. Two protruding plates 3322 protrude upwardly from a portion adjacent to the left lateral side of the main plate 330. The two protruding plates 3322 are spaced from each other and parallel to the left lateral side of the main plate 330. Each of the protruding plates 3322 defines a clipping hole 334 therein corresponding to a third clipping piece 314 of the first structure member 31, for clipping the first structure member 31. Two mounting bars 3380 are formed at rear and front sides of the main plate 330, respectively. Each of the mounting bars 3380 is parallel to the rear or front side and spans the operating hole 332. Two clipping protrusions 338 are formed at two opposite ends of the mounting bar 3380, respectively. The clipping protrusions 338 are similar to the clipping protrusions 337, i.e. protrudes upwardly and slantways, for clipping the fourth structure member 34.

The fourth structure member 34 is made of plastic, and includes a main plate 340, two mounting poles 341 formed at a right lateral side of the main plate 340, and two springs 3410 placed around the two positioning poles 341 respectively. A flange 3460 extends downwardly from the right lateral side of the main plate 340. The flange 3460 defines three clipping recesses 345 therein. The clipping recesses 345 face downwardly and are evenly spaced from each other. There are two protruding tabs 3450 formed on the flange 3460 at two opposite sides of each of the clipping recesses 345. A location of the clipping recesses 345 in the fourth structure member 34 corresponding to that of the engaging claws 325 on the second structure member 32 and that of the clipping hole 335 of the third structure 33 respectively. A width of a middle one of the three clipping recesses 345 is larger than that of each of the other two of the three clipping recesses 345. The two mounting poles 341 extend from portions of the flange 3460 among the three clipping recesses 345. The flange 3460 further defines a plurality of heat dissipation pores therein. Two engaging tabs 347 extend perpendicularly from a free end of the flange 3460. The two engaging tabs 347 are parallel to the main plate 340 and located at front and rear ends of the flange 3460, respectively. The two engaging tabs 347 are configured for fixing the fourth structure member 34 on the third structure member 33. The main plate 340 defines an operating hole 342 therein adjacent to a left lateral side thereof corresponding to the operating hole 312 of the first structure member 31 and the operating hole 332 of the third structure member 33. Three buckling pieces 344 are formed on the left lateral side of the main plate 340. Each of the buckling pieces 344 extends horizontally from the left lateral side of the main plate 340 and then extends downwardly. The three buckling pieces 344 are evenly spaced from each other. The fourth structure member 34 engages with the cabinet 500 via the buckling pieces 344.

The locking member 35 includes a handle 350, a bolt 351 running through an end portion of the handle 350 and a nut 352 placed around the bolt 351. When the bolt 351 is forced to rotate, the handle 350 rotates as a rotation of the bolt 351. One end of the bolt 351 is screwed into the handle 350. The other end of the bolt 351 expands outwardly to from a cap portion 3510. The cap portion 3510 defines a dead hole (not shown) therein to match an operating tool which is used to force the bolt 351 to rotate.

Referring to FIGS. 2 and 3, during assembly of the first mounting part 30, the first structure member 31, the second structure member 32, the third structure member 33 and the fourth structure member 34 are stacked together in order. The contraposition recess 3101 of the first structure member 31, the contraposition recess 3201 of the second structure member 32 and the contraposition recess 3301 of the third structure member 33 are aligned with other. The operating holes 312 of the first structure member 31, the operating hole 332 of the third structure member 33 and the operating hole 342 of the fourth structure member 34 are aligned with other. The first clipping pieces 3103 of the first structure member 31 clip the protruding portion 3302. The second clipping pieces 313 of the first structure member 31 clip the engaging tabs 333 of the third structure member 33. The second clipping pieces 314 of the first structure member 31 are engaged in the clipping holes 334 of the third structure member 33. The positioning pole (not shown) on the bottom face of the hooking plates 331 of the third structure member 33 is inserted into the buckling hole 3110 of a corresponding buckling piece 311 of the first structure member 31. The second structure member 32 is sandwiched between the first structure member 31 and the third structure member 33. The three engaging claws 325 of the second structure member 32 are received in the three clipping holes 335 respectively. A gap is formed between each of the engaging claws 325 and the main plate 320 of the second structure member 32. The second structure member 32 is slidable relative to the third structure member 33, so as to sandwich the main plate 330 of the third structure member 33 in the space between the engaging claws 325 and the main plate 320 of the second structure member 32. The clipping protrusions 337 of the third structure member 33 clip on the engaging tabs 347 of the fourth structure member 34 respectively. The clipping protrusions 338 clip on the front and rear lateral sides 348 of the main plate 340 of the fourth structure member 34 respectively. The three buckling pieces 344 are located at an outside of the left lateral side of the third structure member 33 and staggered with the two protruding plates 3322 of the third structure member 33. The mounting pole 341 extends through the spring 3410 and then is inserted into the blocking protrusions 3310. The protruding tabs 3450 located at two opposite sides of each clipping recesses 345 respectively abut against outsides of two arm portions 3252 of a corresponding engaging claw 325 of the second structure member 32. Each of the protruding tabs 3450 is sandwiched between the hooking shoulder 3253 and the hooking portion 3254 at two opposite ends of a corresponding arm portion 3252, thus mounting the second structure member 32 and the fourth structure member 34 together. When the second structure member 32 slides along the bottom face of the third structure member 33 to drift a little distance from a left side to a right side, the fourth structure member 34 drift to the right side in a corresponding distance relative to the third structure member 33 to make the buckling pieces 344 draw back towards the right side. Furthermore, each of the springs 3410 is compressed between the flange 3460 and a corresponding blocking protrusion 3310. When the force applied on the second structure member 32 is withdrawn, the fourth structure member 34 is pushed by the compressed springs 3410 to drift to the left side relative to the third structure member 33 until the left lateral side of the fourth structure member 34 abuts against the protruding plates 3322.

The bolt 351 of the locking member 34 is rotatably received in the locking hole 3305 of the protruding portion 3302 of the third structure member 33. The protruding portion 3302 is sandwiched between the cap 3510 of the bolt 351 and the nut 352. when the handle 350 points to the flange 3460, a free end of the handle 350 abuts against the flange 3460 and a frontmost protruding tabs 3450 of the fourth structure member 34 to prevent a movement of the fourth structure member 34. Alternatively, when the locking member 35 is driven to rotate in an angle, the handle 350 deviates a perpendicular portion relative to the flange 346, the fourth structure member 34 and the second structure member 32 is able to drift relative to the third structure member 33. When the assembly of the first mounting part 30 is completed, the first mounting part 30 is mounted on the first side wing 13 of the panel 10 in a manner of spot welding, in particular, it is carried out between the first structure member 31 and the first side wing 13. In the first mounting part 30, the first structure member 31 is configured for mounting the first mounting part 30 on the panel 10. The second structure member 32 and the third structure member 33 act as a supporting frame for the first structure member 31 and the fourth structure member 34. The fourth structure member 34 is configured for locking the first mounting part 30 on the cabinet 500. The locking member 35 acts as a controller for controlling a movement of the fourth structure member 34.

Figure 4:
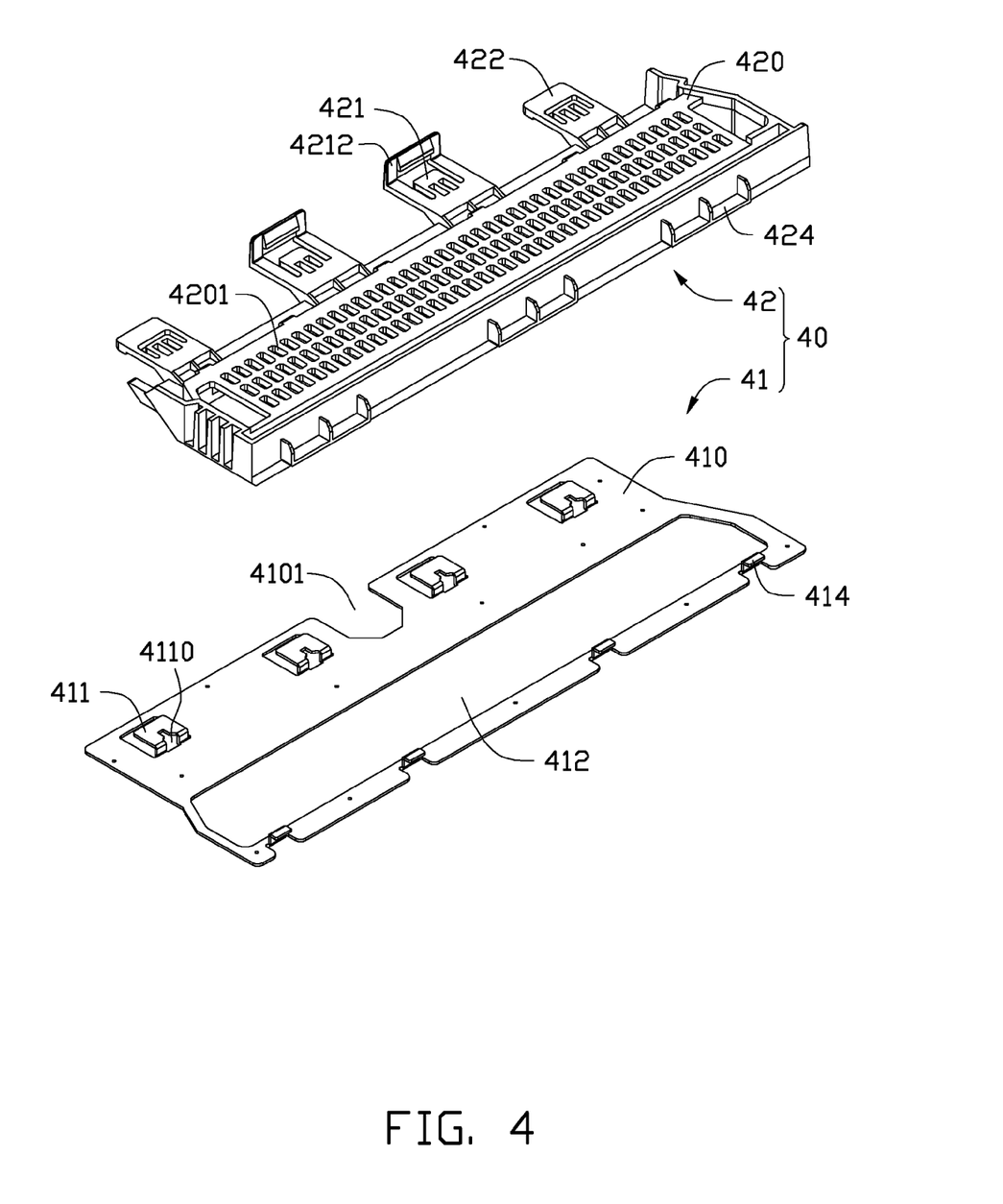
FIG. 4 is an enlarged view of a second mounting part of the panel assembly of FIG. 1.

Referring to FIG. 4, the second mounting part 40 includes a first structure member 41 and a second structure member 42 mounted on the first structure member 41. The first structure member 41 is a metallic plate. The first structure member 41 is mounted on the panel 10 in a manner of spot welding. The first structure member 41 is similar to the first structure member 31 of the first mounting part 30. The first structure member 41 includes a main body 410. The main body 410 defines a contraposition recess 4101 in a middle portion of a left lateral side thereof. The contraposition recess 4101 faces a left side of the main body 410 and is aligned with the slot 12 of the panel 10. Four L-shaped buckling pieces 411 are formed on a portion of the main plate 410 adjacent to the left lateral side of the main plate 410. The contraposition recess 4101 is located between two innermost buckling pieces 411. Each of the buckling pieces 411 includes a vertical portion extending perpendicularly from the main body 410 and a horizontal portion extending horizontally from a free end of the vertical portion. The buckling piece 411 defines a buckling hole 4110 therein. The buckling hole 4110 extends from the vertical portion towards the horizontal portion. The buckling hole 4110 is configured for mounting the second structure member 42 of the second mounting part 40. A right portion of the main body 410 has a shape identical with that of the second side wing 14 of the panel 10. An operating hole 412 is defined in the left portion corresponding to the first opening 130 of the first side wing 13. Four clipping pieces 414 are formed at a portion of the main plate 410 adjacent to a left lateral side of the main body 410, for mounting the second structure member 42.

The second structure member 42 is made of plastic and includes a main plate 420. The main plate 420 defines a plurality of ventilating holes 4210 for dissipating heat in the cabinet 500. There are two first hooking plates 421 and two second hooking plates 422 are formed on a left lateral side of the main plate 420. The first hooking plates 421 and the second hooking plates 422 are evenly spaced from each other.

The two first hooking plates 421 are positioned between the two second hooking plates 422. Each of the first hooking plates 421 has a similar structure with the hooking plates 331 of the first mounting part 30. The first hooking plate 421 extends outwardly from the left lateral side of the main body 420. A vertical portion 4212 extends upwardly and perpendicularly from a free end of the first hooking plate 421, for engaging with the strengthening frame 20. The second hooking plate 422 extends outwardly from the left lateral side of the main body 420 towards the same direction as the first hooking plate 421 extends to. Each of the second hooking plate 422 has a width less than that of the positioning recess 222 of the strengthening frame 20. There are three engaging member 424 formed on a right lateral side of the main plate 420. Each of the engaging members 424 is substantially E-shaped with three claw portions extending upwardly. The engaging member 424 is configured for engaging with the cabinet 500.

Referring to FIGS. 2 and 4, during assembly of the second mounting part 40, the second structure member 42 is placed on the first structure member 41 with the ventilating holes 4201 facing the operating hole 412. The clipping pieces 414 of the first structure member 41 clipping on an inner face of the right lateral side of the second structure member 42. The four buckling piece 411 bucks on the two first hooking plates 421 and the two second hooking plates 422 respectively. The first structure member 41 is mounted on the panel 10 in a manner of spot welding.

Referring to FIG. 1 again, the first mounting part 30 and the second mounting part 40 are mounted on the first and second side wings 13, 14 respectively. The hooking plates 331 of the first mounting part 30 connects with the first locking plate 210 of the strengthening frame 20 with the vertical portion 3312 thereof hooking in the first locking slots 21 of the first locking plate 210. The hooking plates 421 of the second mounting part 40 connects with the second locking plate 220 of the strengthening frame 20 with the vertical portion 4212 thereof hooking in the second locking slots 21 of the second locking plate 220. The positioning pole 3311 of the first mounting part 30 is received in the positioning hole 211 of the first locking plate 210. Furthermore, one of the second hooking plates 422 adjacent to a rear side of the main plate 420 is received in the positioning recess 222 of the strengthening frame 20. Via the aforementioned mounting structures, the strengthening frame 20 is mounted on a rear portion of the panel 10 between the first mounting part 30 and the second mounting part 40. Two of the transverse ribs 201 are located at two opposite sides of the three slots 12 respectively. Another one of the transverse ribs 201 is located at a rear lateral side of the panel 10. The three transverse ribs 201 prevent the hands of a man from removing the panel 10 illegally from the slots 12 and the rear lateral side of the panel 10.

Figure 5:
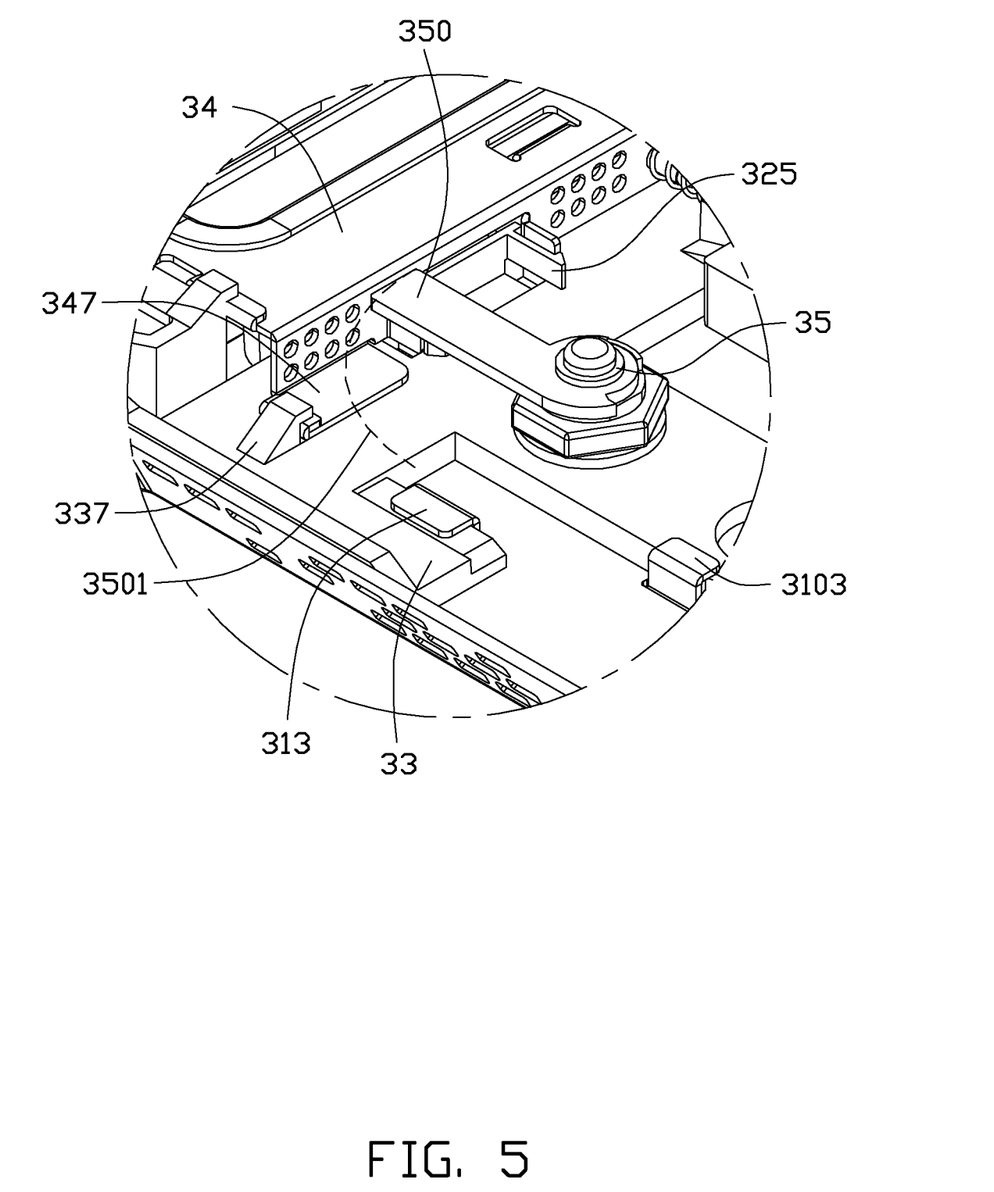
FIG. 5 is an enlarged view of the circled portion V of FIG. 1.

Referring to FIGS. 1 and 5, during assembling the panel assembly 100 on the cabinet 500, the locking member 35 is rotated to cause the free end of the handle 350 thereof to depart from the flange 3460. The engaging member 424 of the second mounting part 40 is then inserted into a corresponding position in the cabinet 500 and engages with a right sidewall of the cabinet 500. A force is applied on the left lateral side of the second structure member 32 of the first mounting part 30 to cause the fourth structure member 34 to move rightwards. In this state, the buckling pieces 344 of the fourth structure member 34 move rightwards towards a middle direction of the panel 10 correspondingly. Then the first mounting part 30 is pushed to another corresponding position in the cabinet 500 opposite to the right side wall. Then the force applied on the second structure member 32 of the first mounting part 30 is removed. The fourth structure member 34 is pushed by the spring 3410 to move leftwards to cause the buckling pieces 344 to return their original positions and to engage a left sidewall of the cabinet 500. Finally the locking member 35 is rotated to cause the free end of the handle 350 to abut against the flange 3460. This can prevent the fourth structure member 34 from a sudden movement which may cause disengagement between the first mounting part 30 and the left sidewall of the cabinet 500.

During disassembling the panel assembly 100 from the cabinet 500, the locking member 35 is rotated to cause the free end of the handle 350 thereof to depart from the flange 3460. The free end of the handle 350 rotates along an arc broken line shown in FIG. 5. A force is applied on the left lateral side of the second structure member 32 of the first mounting part 30 to cause the fourth structure member 34 to move rightwards. The buckling pieces 344 of the fourth structure member 34 move rightwards towards a middle direction of the panel 10 correspondingly. Then the first mounting part 30 and the second mounting part 40 can be removed form the left side wall and the right wall of the cabinet 500 in order.

During assembling and disassembling processes aforementioned, the panel assembly 100 can be easily attached to or detached from the cabinet 500 only via simple operating of the first mounting part 30 instead of screwing of a plurality of bolts. Thus the replacement, maintenance or repair of the electronic components inside the cabinet 500 is convenient and can save much time. Furthermore, the locking member 35 is rotated by a given tool which is contrived to match with the dead hole defined in the cap portion 3510. Therefore, the enclosure having the panel assembly 100 and the cabinet 500 has a good security.

It is to be understood, however, that even though numerous characteristics and advantages of the exemplary embodiments have been set forth in the foregoing description, together with details of the structures and functions of the embodiments, the disclosure is illustrative only; and that changes may be made in detail, especially in matters of shape, size, and arrangement of parts within the principles of the embodiments to the full extent indicated by the broad general meaning of the terms in which the appended claims are expressed.

What is claimed is:

1. A panel assembly, configured for mounting on a cabinet, comprising:
   a panel, a first mounting part and a second mounting part mounted at two opposite sides of the panel, wherein the first mounting part and the second mounting part each comprise a plurality of buckling pieces, the buckling pieces of the first mounting part and the second mounting part are configured for mounting the first mounting part and the second mounting part on two opposite sidewalls of the cabinet respectively, the buckling pieces of the first mounting part are moveable relative to the first mounting part, the buckling pieces of the second mounting part are immovable and configured for engaging with one of the two opposite sidewalls of the cabinet, when the buckling pieces of the first mounting part are in a free state, the buckling pieces of the first mounting part are attached on the other one of the two opposite sidewalls of the cabinet, and when the buckling pieces of the first mounting part are pushed to move towards the second mounting part, the first mounting part is detached from the other one of the two opposite sidewalls of the cabinet;
   wherein the first mounting part comprises a first structure member mounted on the panel, a second structure member movably mounted on the first structure member, a third structure member mounted on the first structure member and a fourth structure member attached with the second structure member, and the buckling pieces of the first mounting part are formed on the fourth structure member.

2. The panel assembly of claim 1, wherein the first structure member, the second structure member, the third structure member and the fourth structure member are assembled together via a plurality of clipping pieces formed thereon.

3. The panel assembly of claim 2, wherein the fourth structure member of the first mounting part comprises a spring located between the fourth structure member and the third structure member, and when the fourth structure member is pushed to move to the second mounting part, the spring is compressed between the fourth structure member and the third structure member.

4. The panel assembly of claim 3, wherein the first structure member, the third structure member and the fourth structure member of the first mounting part each defines an operating hole therein, the operating holes of the first structure member, the third structure member and the fourth structure member are aligned with each other, and the second structure member is exposed in the operating holes of the first structure member, the third structure member and the fourth structure member.

5. The panel assembly of claim 1, further comprising a strengthening frame, wherein the strengthening frame spans on the panel and is connected between the first mounting part and the second mounting part.

6. The panel assembly of claim 5, wherein the strengthening frame comprises a plurality of transverse ribs and a plurality of longitudinal ribs interconnecting with each other perpendicularly.

7. The panel assembly of claim 6, wherein the first mounting part further comprises a locking member, the locking member comprises a bolt rotatably running through the third structure member and a handle mounted at one end of the bolt, and the bolt is rotatable to cause the handle to abut against the fourth structure member or away from the fourth structure member, so as to control a movement of the fourth structure member.

8. The panel assembly of claim 7, wherein an opposite end of bolt is formed a cap portion, the cap portion defines a dead hole therein, the third structure member is sandwiched between the handle and the cap, and the dead hole is configured for matched with an operating tool to rotate the bolt.

9. The panel assembly of claim 1, wherein the buckling pieces of the second mounting part are immovable relative to the panel.

10. The panel assembly of claim 9, wherein the second mounting part comprises a first structure member mounted on the panel and a second structure member mounted on the first mounting structure, and the second structure member is overlapped on the first structure member.

11. The panel assembly of claim 10, wherein the second structure member of the second mounting part defines a plurality of ventilating holes therein.

12. A panel assembly, configured for mounting on a cabinet, comprising:
a panel, a first mounting part and a second mounting part mounted at two opposite sides of the panel, wherein the first mounting part and the second mounting part each comprise a plurality of buckling pieces, the buckling pieces of the first mounting part and the second mounting part are configured for mounting the first mounting part and the second mounting part on two opposite sidewalls of the cabinet respectively, the buckling pieces of the first mounting part are moveable relative to the first mounting part, the buckling pieces of the second mounting part are immovable relative to the panel and configured for engaging with one of the two opposite sidewalls of the cabinet, when the buckling pieces of the first mounting part are in a free state, the buckling pieces of the first mounting part are attached on the other one of the two opposite sidewalls of the cabinet, and when the buckling pieces of the first mounting part are pushed to move towards the second mounting part, the first mounting part is detached from the other one of the two opposite sidewalls of the cabinet, the second mounting part comprises a first structure member mounted on the panel and a second structure member mounted on the first mounting structure, and the second structure member is overlapped on the first structure member, the second structure member of the second mounting part defines a plurality of ventilating holes therein.

13. The panel assembly of claim 12, further comprising a strengthening frame, wherein the strengthening frame spans on the panel and is connected between the first mounting part and the second mounting part.

14. The panel assembly of claim 13, wherein the strengthening frame comprises a plurality of transverse ribs and a plurality of longitudinal ribs interconnecting with each other perpendicularly.

15. The panel assembly of claim 14, wherein the first mounting part comprises a first structure member mounted on the panel, a second structure member movably mounted on the first structure member, a third structure member mounted on the first structure member and a fourth structure member attached with the second structure member, and the buckling piece of the first mounting part are formed on the fourth structure member.

16. The panel assembly of claim 15, wherein the first mounting part further comprises a locking member, the locking member comprises a bolt rotatably running through the third structure member and a handle mounted at one end of the bolt, and the bolt is rotatable to cause the handle to abut against the fourth structure member or away from the fourth structure member, so as to control a movement of the fourth structure member.

17. The panel assembly of claim 16, wherein an opposite end of bolt is formed a cap portion, the cap portion defines a dead hole therein, the third structure member is sandwiched between the handle and the cap, and the dead hole is configured for matched with an operating tool to rotate the bolt.

* * * * *